United States Patent [19]
Shinozuka et al.

[11] Patent Number: 6,136,213
[45] Date of Patent: Oct. 24, 2000

[54] GAS POLISHING METHOD

[75] Inventors: Syuhei Shinozuka; Kaori Miyoshi; Akira Fukunaga, all of Kanagawa-ken, Japan

[73] Assignee: Ebara Corporation, Tokyo, Japan

[21] Appl. No.: 09/030,833

[22] Filed: Feb. 26, 1998

[30] Foreign Application Priority Data

Feb. 26, 1997 [JP] Japan ................................ 9-058341

[51] Int. Cl.⁷ ................................ C23F 1/02; C23F 1/24; C03C 25/68
[52] U.S. Cl. ........................ 216/58; 216/67; 204/298.33; 156/345; 438/706; 438/710
[58] Field of Search ........................ 204/298.33; 216/58, 216/67; 156/345; 438/706, 710

[56] References Cited

FOREIGN PATENT DOCUMENTS

| | | |
|---|---|---|
| 4-44319 | 2/1992 | Japan . |
| 07161688 | 6/1995 | Japan . |

*Primary Examiner*—Yogendra Gupta
*Assistant Examiner*—Charles Boyer
*Attorney, Agent, or Firm*—Wenderoth, Lind & Ponack, L.L.P.

[57] ABSTRACT

Etching of an object is achieved by jetting etching gas onto the object from a gas jetting nozzle. A gas jetting pipe for jetting the etching gas and a discharge pipe for discharging the jetted gas are designed as a coaxial dual pipe structure. The etching gas is jetted from the gas jetting pipe toward the object and, at the same time, excess etching gas is discharged through the discharge pipe.

5 Claims, 5 Drawing Sheets

GAS POLISHING METHOD

BACKGROUND OF THE INVENTION

The present invention relates to a gas etching method in which an object to be etched is etched by jetting an etching gas onto the object for etching, and a jetting nozzle used in such a gas etching method.

In order to etch an object such as a silicone wafer by using a gas, generally, the etching gas is activated by plasma or the like and, at the same time, the activated gas flow is controlled by electrodes or a magnetic force. However, in some cases, the silicone wafer, poly-silicone film and/or $SiO_2$ film are etched by using only the etching gas.

In this case, regarding the etching method, as shown in FIG. 3, generally, an object for etching 101 mounted on a support 102 is entered into a reaction vessel 103, the reaction vessel is depressurized by evacuation through a discharge opening 104, and the etching gas is jetted on a portion to be etched of the object for etching from an end of a etching gas introducing pipe (nozzle) 105 for a predetermined time period.

The following formula (1) indicates only a typical chemical reaction of etching of silicone. The etching gas jetted from the end of etching gas introducing pipe 105 is struck against the object for etching to form reactant with the object and is gasified for effecting the etching.

$$Si+4F^* \rightarrow SiF_4 \circ + C_2F_6 \tag{1}$$

In this case, excess gas for etching is discharged from reaction vessel 103 through discharge opening 104, as shown in the arrows in FIG. 3.

As mentioned above, although the excess gas is discharged from the reaction vessel 103 through the discharge opening 104, if a path to the discharge opening 104 is long, a portion of the object 101 other than the portion to be etched is also etched away, which is problematic. In particular, when an amount to be etched is great, such as several $\mu$m~several tens of $\mu$m, no problem would be caused. However, if the amount to be etched is small, such as several hundreds of Å~several thousands of Å, then, a great disadvantage will be caused.

SUMMARY OF THE INVENTION

The present invention is made in consideration of the above-mentioned problems, and an object of the present invention is to provide a gas etching method, a gas jetting nozzle and a gas etching apparatus, which can eliminate the above-mentioned conventional drawbacks and in which only a portion of an object for etching which is desired to be etched can be etched with high accuracy.

To achieve the above object, according to the present invention, there is provided a etching method for etching an object by jetting an etching gas onto the object from a gas jetting nozzle, wherein: a gas jetting pipe for jetting an etching gas and a discharge pipe for discharging the etching gas jetted from said gas jetting pipe are provided, wherein said gas jetting pipe and said discharge pipe are designed to have a coaxial dual pipe structure and the etching gas is jetted from said gas jetting pipe toward the object for etching and, at the same time, excess etching gas is discharged through said discharge pipe.

The present invention further provides a gas jetting nozzle for jetting etching gas toward an object for etching, wherein: a gas jetting pipe for jetting the etching gas and a discharge pipe for discharging the jetted gas are provided, and said gas jetting pipe and said discharge pipe are designed to have a coaxial dual pipe structure.

In the gas jetting nozzle according to the present invention, in said dual pipe structure constituted by said gas jetting pipe and said discharge pipe, said gas jetting pipe or said discharge pipe is disposed inside, and said discharge pipe or said gas jetting pipe is disposed outside.

In the gas jetting nozzle according to the present invention, in said dual pipe structure constituted by said gas jetting pipe and said discharge pipe, tip ends of both pipes are positioned in flush with each other or a tip end of one of said pipes is protruded outwardly from a tip end of the other pipe by a predetermined amount.

The present invention further provides a gas etching apparatus comprising: a gas jetting nozzle according to any one of the arrangement stated above; a reaction vessel; and means for jetting an etching gas from a gas jetting pipe of said gas jetting nozzle onto an etching portion of an object for etching positioned within said reaction vessel and, at the same time, for discharging excess etching gas for reaction through said gas discharge pipe.

As mentioned above, when the object for etching is etched by using the gas jetting nozzle having the dual pipe structure, only a portion for etching is etched, and the etching gas does not flow to a portion where etching is not desired, with the result that the etching having very sharp profile can be effected.

Therefore, according to the present invention, with the use of a gas jetting nozzle in which a gas jetting pipe and a discharge pipe are designed to have a coaxial dual pipe structure, and by jetting the etching gas from the gas jetting pipe toward the object for etching and, at the same time, by discharging an excess etching gas through the discharge pipe, a gas etching method, a gas jetting nozzle and a gas etching apparatus in which only the portion of the object where etching is desired can be etched with high accuracy can be provided.

The above and other objects, features and advantages of the present invention will become more apparent from the following description when taken in conjunction with the accompanying drawings in which a preferred embodiment of the present invention is shown by way of illustrative examples.

BRIEF DESCRIPTION OF THE DRAWINGS

FIG. 1 is a view showing a construction of a gas jetting nozzle according to the present invention, wherein

DETAILED DESCRIPTION OF PREFERRED EMBODIMENTS

Figure 1A:
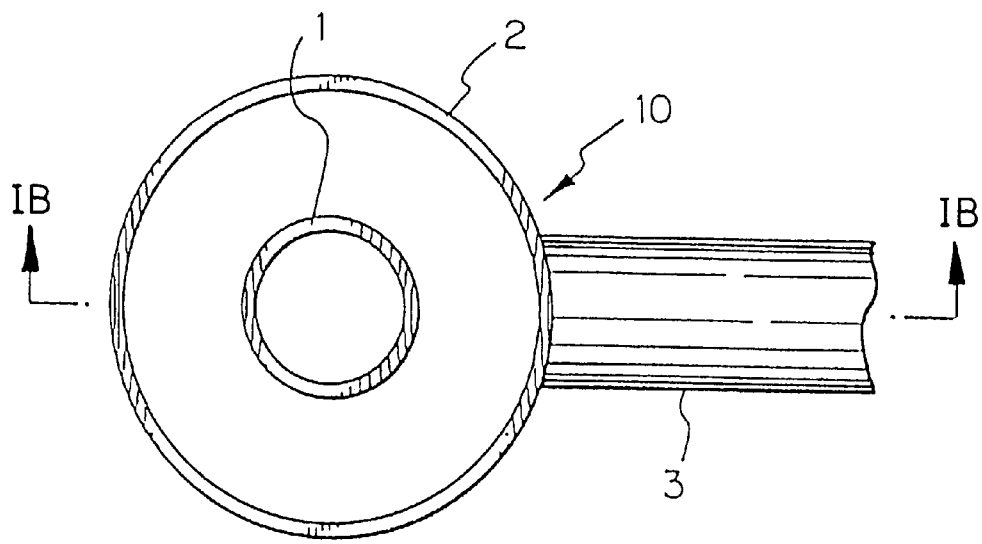
FIG. 1A is a plan view and FIG. 1B is a sectional view taken along the line A—A in FIG. 1A.
Figure 1B:
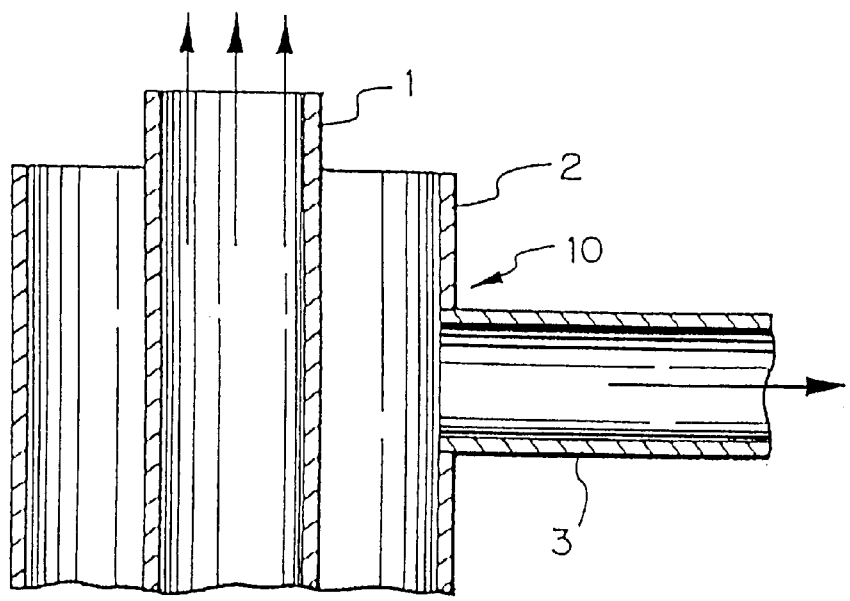

The present invention will now be explained in connection with preferred embodiments thereof with reference to the accompanying drawings. FIG. 1 shows a construction of a gas jetting nozzle according to the present invention, wherein FIG. 1A is a plan view of the gas jetting nozzle, and FIG. 1B is a sectional view taken along the line A—A in FIG. 1A. As shown, the gas jetting nozzle 10 comprises a gas jetting pipe 1 for jetting reactive etching gas, and a discharge pipe 2 surrounding the gas jetting pipe and adapted to discharge excess etching gas. The gas jetting pipe 1 and the discharge pipe 2 are designed as a coaxial dual pipe structure, and the discharge pipe 2 is communicated with a discharge pipe 3 to which a discharge pump (not shown) is connected. Further, a tip end of the gas jetting pipe 1 protrudes outwardly of a tip end of the discharge pipe 2 by a predetermined amount.

In the gas jetting nozzle 10 having the above-mentioned construction, the etching gas is jetted from the gas jetting pipe 1 toward an object for etching to etch the object for etching, and, at the same time, excess etching gas is immediately discharged through the discharge pipe 2.

Figure 2:
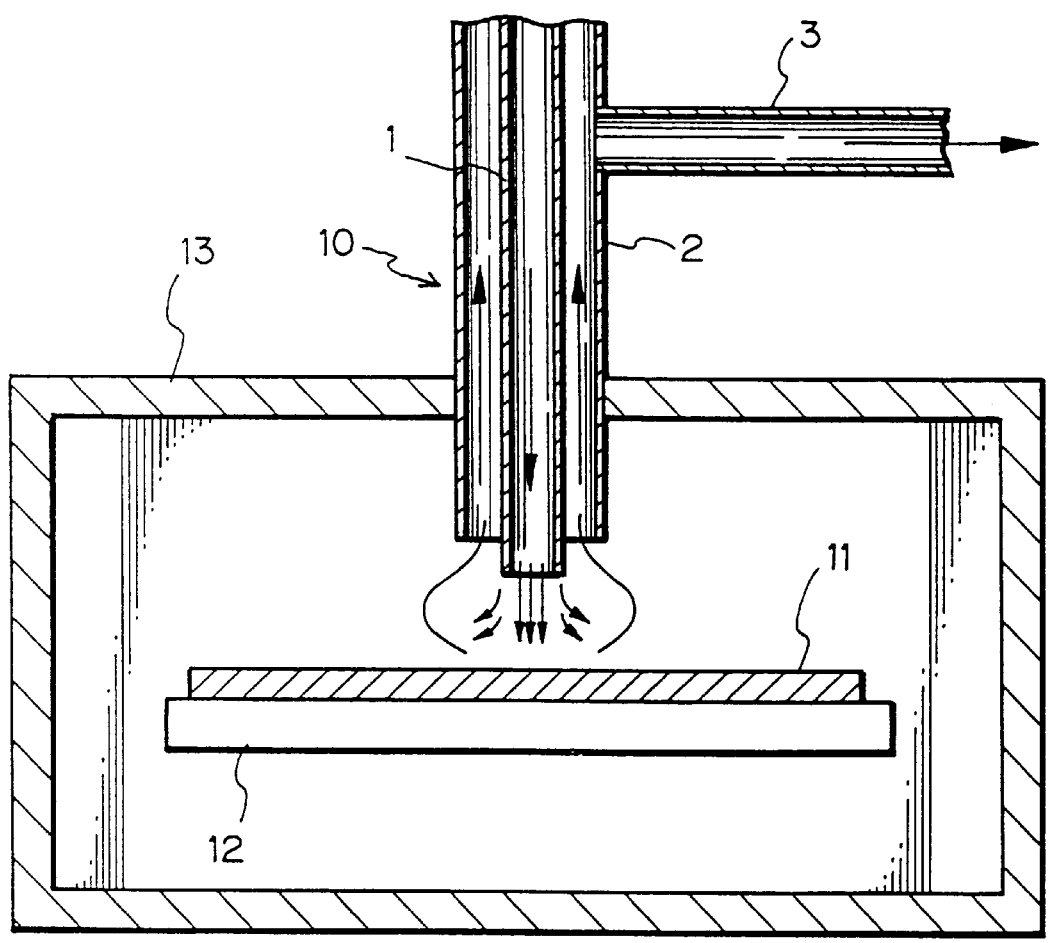
FIG. 2 is a schematic view showing a gas etching apparatus using the gas jetting nozzle according to the present invention.

FIG. 2 is a schematic view showing a gas etching apparatus using the gas jetting nozzle having the dual pipe structure stated above. An object for etching 11 such as a silicone wafer is placed on a suscepter 12 disposed within a reaction vessel 13. The etching gas is jetted from the gas jetting pipe 1 of the gas jetting nozzle 10 toward an etching portion of the object for etching 11 to etch the portion to be etched, and, at the same time, the excess etching gas is discharged through the discharge pipe 2.

As mentioned above, by immediately discharging the excess etching gas jetted from the gas jetting pipe 1 but not contributing to the etching through the discharge pipe 2 surrounding the gas jetting pipe 1, it is possible to prevent excess etching gas which did not contribute to the etching from etching portions other than the portion desired to be etched (etching portion) of the object 11.

That is to say, if a gas flow path through which the excess etching gas which did not contribute to the etching reaches the discharge opening is long, there is a great possibility that it etches the portions other than the portion, which is desired to be etched, of the object 11. However, by using the gas jetting nozzle having the dual pipe structure, since the excess etching gas which did not contribute to the etching is immediately discharged from the surroundings of the gas jetting pipe 1 through the discharge pipe 2, there is extremely little possibility that the portions other than the desired portion is etched.

In the illustrated embodiment, the gas jetting nozzle 10 having the dual pipe structure in which the discharge pipe 2 surrounds the gas jetting pipe 1 was explained. However, in a dual pipe structure, even when the discharge pipe 2 is disposed inside and the gas jetting pipe 1 is disposed outside (i.e. the gas jetting pipe is provided so as to surround the discharge pipe), the mechanism for immediately discharging the excess etching gas which did not contribute to the etching is unchanged.

Since most of the etching gas has high corrosion property, the gas jetting nozzle having the dual pipe structure is preferably be formed of anti-corrosion material such as SUS material, nickel group material such as Inconel or a Teflon material. In the illustrated embodiment, the SUS material was used.

An inner diameter of the gas jetting pipe 1 for jetting the etching gas and an inner diameter of the discharge pipe 2 are determined on the basis of an amount of the etching gas to be used. In the illustrated embodiment, the inner diameter of the gas jetting pipe 1 is selected to ¼ inch, and the inner diameter of the discharge pipe 2 is selected to 10.5 mm.

In the gas jetting nozzle having the dual pipe structure shown in FIG. 1, although the tip end of the gas jetting pipe 1 protrudes outwardly from the tip end of the discharge pipe 2, even when the tip end of the gas jetting pipe 1 and the tip end of the discharge pipe 2 are disposed in flush with each other (same level) or even when the tip end of the discharge pipe 2 protrudes outwardly from the tip end of the gas jetting pipe 1, it was experimentally confirmed that sufficient result can be obtained.

Figure 3:
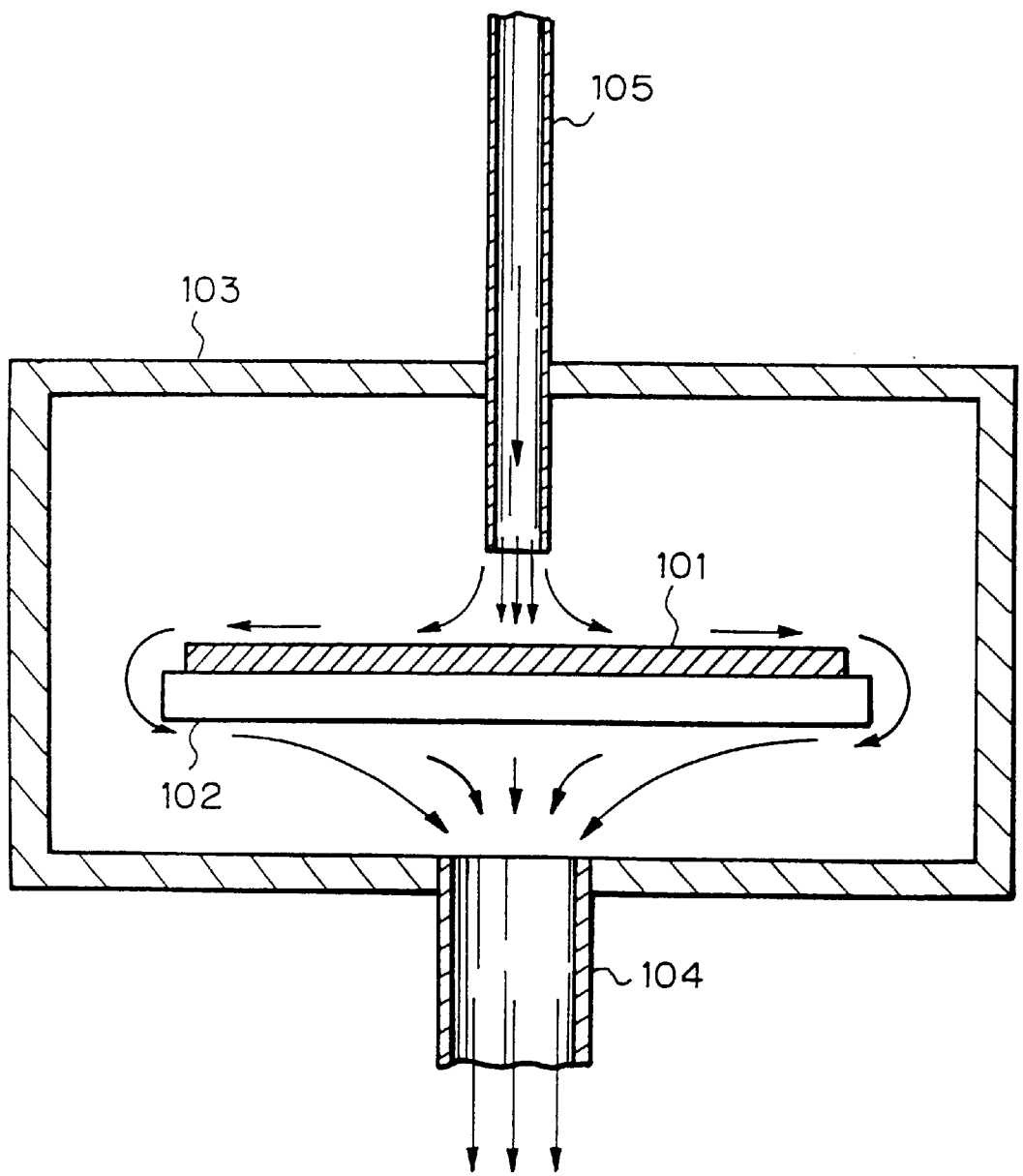
FIG. 3 is a schematic view of a conventional gas etching apparatus using a gas jetting nozzle.
Figure 4:
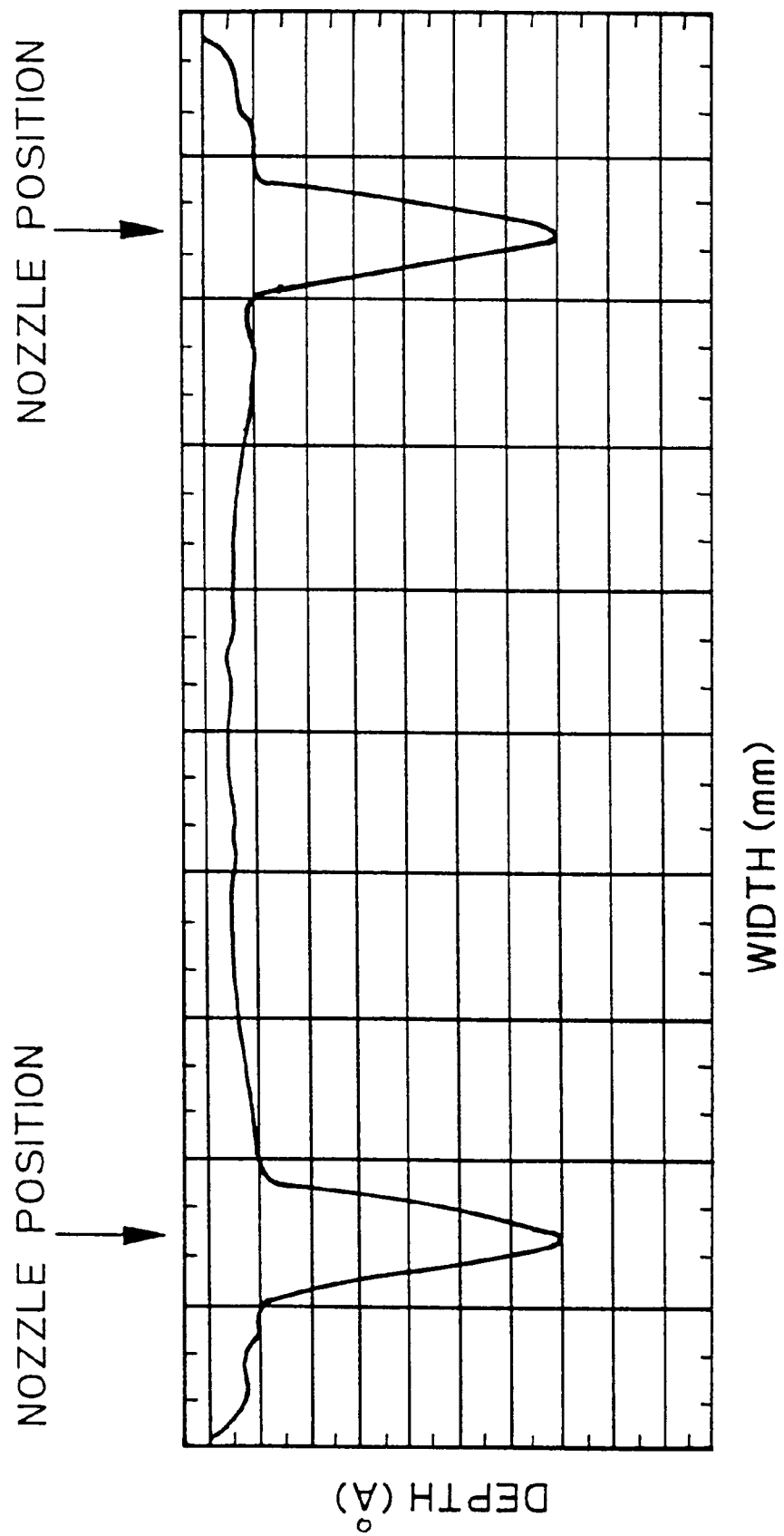
FIG. 4 is a graph showing an example wherein a silicone wafer is etched by using the gas jetting nozzle according to the present invention.
Figure 5:
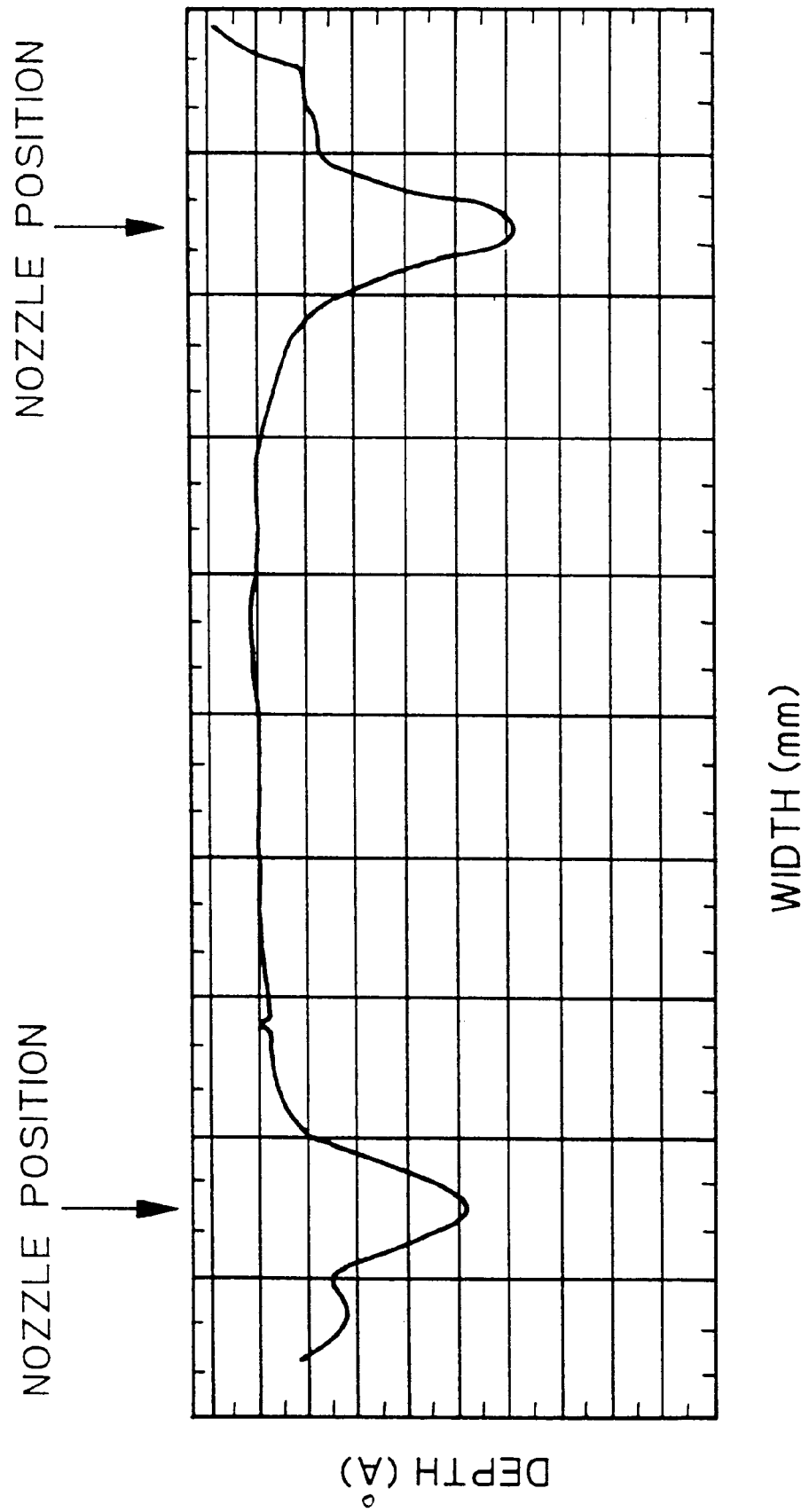
FIG. 5 is a graph showing an example wherein a silicone wafer is etched by using a conventional gas jetting nozzle.

FIG. 4 is a graph showing the results of an example wherein a silicone wafer is etched by using the gas jetting nozzle having the dual pipe structure shown in FIG. 1 (see the etching apparatus in FIG. 2), and FIG. 5 is a graph showing the results of an example wherein a silicone wafer is etched by using a gas etching apparatus utilizing a gas jetting nozzle of a single pipe structure shown in FIG. 3. Incidentally, the etching gas used in the examples is $ClF_3$ gas.

As is apparent from FIGS. 4 and 5, when the etching is effected by using the gas jetting nozzle having the dual pipe structure according to the present invention, only a portion positioned immediately below the gas jetting nozzle is etched and the etching profile is very sharp. To the contrary, as shown in FIG. 3, when the etching is effected with the etching gas introducing pipe 105 and the discharge opening 104 spaced apart from each other, even at the portion immediately below the nozzle, the etching is effected in such a manner that the skirt surrounding that portion is also widely etched, with the result that the etching profile becomes obscure.

Further, an etching amount at a central portion provided when the gas jetting nozzle having the dual pipe structure shown in FIG. 1 is used is less than ¼ of the etching amount provided when the gas jetting nozzle having the single pipe structure shown in FIG. 3 is used.

As mentioned above, when the object for etching is etched by using the gas jetting nozzle having the dual pipe structure, only the etching portion is etched, and the etching gas does not flow to a portion where etching is not desired and etching having very sharp profile can be obtained.

As mentioned above, according to the present invention, since the gas jetting nozzle is constituted as a dual pipe structure where a gas jetting pipe and a discharge pipe are concentrically disposed and the etching gas is jetted from the gas jetting pipe toward an object for etching and, at the same time, the excess etching gas for reaction is discharged through the discharge pipe, a gas etching method, a gas jetting nozzle and a gas etching apparatus in which only the desired portion for etching can be etched with high accuracy can be provided.

What is claimed is:

1. A method for etching a predetermined portion of an object to be etched, said method comprising:

providing a gas jetting nozzle designed as coaxial dual pipe structure including a cylindrical gas jetting pipe and a cylindrical discharge pipe being coaxial relative to each other, with one of said cylindrical gas jetting pipe and said cylindrical discharge pipe being positioned within the other of said cylindrical discharge pipe and said cylindrical gas jetting pipe;

jetting etching gas from said cylindrical gas jetting pipe onto said predetermined portion, thereby etching said predetermined portion; and simultaneously discharging excess etching gas through said cylindrical discharge pipe positioned coaxially of said gas jetting pipe.

2. A method as claimed in claim 1 wherein said cylindrical gas jetting pipe is positioned within said cylindrical discharge pipe.

3. A method as claimed in claim 1, wherein ends of said cylindrical gas jetting pipe and said cylindrical discharge pipe are flush with each other.

4. A method as claimed in claim 1, wherein an end of a first of said cylindrical gas jetting pipe and said cylindrical discharge pipe projects beyond an end of a second of said cylindrical discharge pipe and said cylindrical gas jetting pipe.

5. A method as claimed in claim 4, wherein said first of said cylindrical gas jetting pipe and said cylindrical discharge pipe comprises said cylindrical gas jetting pipe.

* * * * *